US009024621B2

(12) United States Patent
Nahar

(10) Patent No.: US 9,024,621 B2
(45) Date of Patent: May 5, 2015

(54) SYSTEM AND METHOD FOR MOUNTING COMPONENTS WITHIN A UTILITY METER

(75) Inventor: Rathindra Nahar, Suwanee, GA (US)

(73) Assignee: General Electric Company, Schenectady, NY (US)

( * ) Notice: Subject to any disclaimer, the term of this patent is extended or adjusted under 35 U.S.C. 154(b) by 462 days.

(21) Appl. No.: 13/436,821

(22) Filed: Mar. 30, 2012

(65) Prior Publication Data

US 2013/0257413 A1 Oct. 3, 2013

(51) Int. Cl.

| | |
|---|---|
| ***G01R 1/06*** | (2006.01) |
| ***H05K 13/04*** | (2006.01) |
| ***G01R 19/00*** | (2006.01) |
| ***G01R 11/04*** | (2006.01) |

(52) U.S. Cl.
CPC ........... *G01R 11/04* (2013.01); *Y10T 29/49002* (2015.01); *Y10T 29/49117* (2015.01)

(58) Field of Classification Search
CPC .. G01R 11/04; G01R 19/145; G01R 31/3682; G01F 15/063; G01N 27/70; H02B 1/50; H02B 1/18
See application file for complete search history.

(56) References Cited

U.S. PATENT DOCUMENTS

| | | | | |
|---|---|---|---|---|
| 5,023,747 A * | 6/1991 | Lindsay | ........................ | 361/117 |
| 7,253,605 B2 * | 8/2007 | Burns et al. | .................. | 324/142 |

* cited by examiner

*Primary Examiner* — Vinh Nguyen
(74) *Attorney, Agent, or Firm* — Parks Wood LLC

(57) ABSTRACT

An embodiment of a system includes a utility meter having an enclosure, a first component and a second component in the enclosure, and a mounting assembly configured to couple the first and second components together in the enclosure. The mounting assembly includes a first mount having first and second prongs disposed about an intermediate space, a second mount configured to extend bi-directionally into the intermediate space between the first and second prongs in opposite first and second directions, and a snap-fit fastener. The snap-fit fastener includes first and second snap portions configured to bi-directionally engage one another in the opposite first and second directions to secure the first and second mounts.

18 Claims, 6 Drawing Sheets

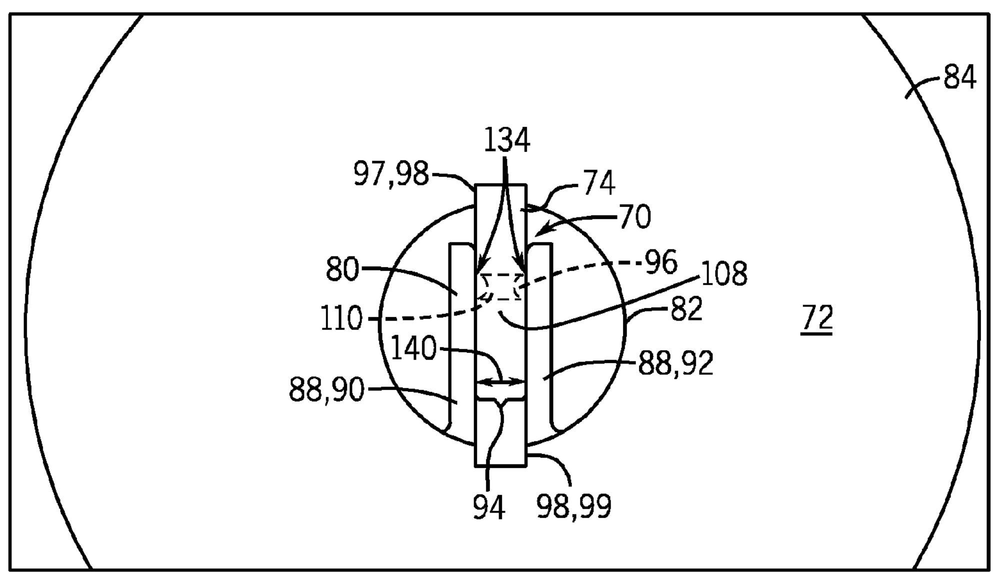
FIG. 7
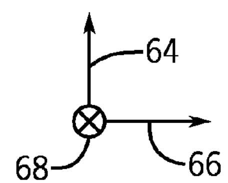

SYSTEM AND METHOD FOR MOUNTING COMPONENTS WITHIN A UTILITY METER

BACKGROUND OF THE INVENTION

The subject matter disclosed herein relates to mount assemblies within a utility meter.

Utility meters incorporate many functionalities relating to the consumption of a utility such as water, electricity, and gas, to name a few. For example, utility meters may enable a utility provider, such as an electricity provider, to remotely monitor a consumer's use of the utility. In this way, the utility provider may rarely, if ever, physically access the utility meter. Various components may be disposed within the utility meter to monitor usage, communicate with the utility, display information, or provide additional functionalities to the utility meter. Over time, some components may be added to a utility meter to replace worn components or to provide additional functionality to the utility meter. Added components may function optimally when disposed in certain locations within the utility meter. However, the geometry of existing components and available space within the utility meter may increase the difficulty of adding components to the utility meter in certain locations. Furthermore, some components or the housing may be configured to only permit unidirectional mounting.

BRIEF DESCRIPTION OF THE INVENTION

Certain embodiments commensurate in scope with the originally claimed invention are summarized below. These embodiments are not intended to limit the scope of the claimed invention, but rather these embodiments are intended only to provide a brief summary of possible forms of the invention. Indeed, the invention may encompass a variety of forms that may be similar to or different from the embodiments set forth below.

In a first embodiment, a system includes a utility meter having an enclosure, a first component and a second component in the enclosure, and a mounting assembly configured to couple the first and second components together in the enclosure. The mounting assembly includes a first mount having first and second prongs disposed about an intermediate space, a second mount configured to extend bi-directionally into the intermediate space between the first and second prongs in opposite first and second directions, and a snap-fit fastener. The snap-fit fastener includes first and second snap portions configured to bi-directionally engage one another in the opposite first and second directions to secure the first and second mounts.

In a second embodiment, a system includes a mounting assembly configured to couple first and second components together. The mounting assembly includes a first mount having first and second cantilevered prongs disposed about an intermediate space. At least one of the first and second cantilevered prongs includes a first snap portion of a snap-fit fastener. The first and second cantilevered prongs are configured to bi-directionally receive a second mount into the intermediate space in opposite first and second directions. The first snap portion is configured to bi-directionally engage a second snap portion of the second mount in the opposite first and second directions to secure the first and second mounts.

In a third embodiment, a method includes receiving a second mount bi-directionally into an intermediate space between first and second prongs of a first mount in opposite first and second directions. The first and second mounts support first and second components. The method also includes engaging first and second snap portions bi-directionally in the opposite first and second directions to secure the first and second mounts. At least one of the first and second prongs includes the first snap portion, and the second mount includes the second snap portion.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein:

FIG. 7 is a front view of an embodiment of the mounting assembly.

DETAILED DESCRIPTION OF THE INVENTION

Figure 1:
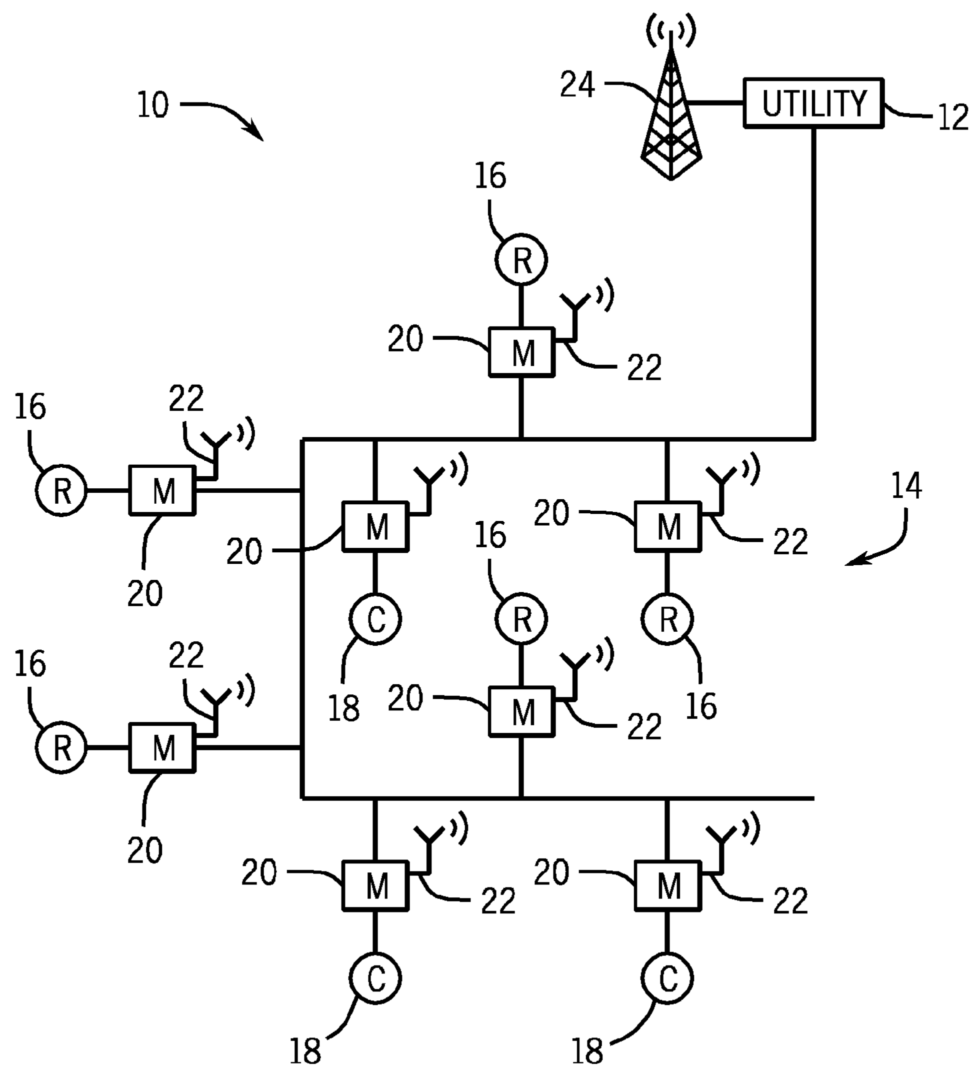
FIG. 1 is a block diagram of an embodiment of an electrical system in which utility meters may monitor utility consumption by various consumers.

One or more specific embodiments of the present invention will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements. The term "bi-directional" may be used to describe that the first component may be inserted or extend through the portion of the first component from two directions.

As noted above, some components of a utility meter may be added to replace worn components and/or to provide additional functionality. Some added components may function optimally when disposed in certain locations within the utility meter. However, the geometry of existing components and available space within the utility meter may increase the difficulty of adding components to the utility meter in certain locations. Accordingly, the disclosed embodiments relate to utility meters having a mounting assembly configured to permit bi-directional mounting of two components in a utility meter enclosure. The mounting assembly may include a snap-fit fastener having first and second snap portions configured to engage one another at least bi-directionally. The mounting assembly may permit added components (e.g., new terminal blades and sensors) to be fit on an existing base without changing the base. The mounting assembly may also provide for mounting components in certain locations without interfering with existing components during mounting. In this way, the mounting assembly may be backwards compatible with existing components and reduce costs associated with adding new components or replacing old components within a utility meter.

The mounting assembly may include a first mount on a first component and a second mount on a second component. The first mount may have two prongs disposed about an intermediated space, and the prongs may extend along one another (e.g., parallel). The two prongs may be disposed in a central region of an annular structure or extend from a perimeter region of the first component. The two prongs may be cantilevered and may be configured to absorb vibration in directions crosswise to the bi-directional mounting direction. The two prongs and second mount of the second component may together form a snap-fit fastener. The snap-fit fastener may include complementary portions such as holes, detents, recesses, protrusions, male-female features, or other snap-fit fasteners that may be joined at least bi-directionally. The two prongs of the first mount may include first snap portion, and the second mount may include a second snap portion of the snap-fit fastener. For example, the first component may be a sensor with cantilevered prongs having opposing detents. The second component may be a terminal blade of an electric meter configured to extend between the cantilevered prongs to engage the detents with the second snap portion (i.e., hole or recess). Thus the mounting assembly may mount the sensor and terminal blade within the utility meter at a desired location relative to other components of the utility meter. The mounting assembly may also align the components in a desired alignment and/or orientation relative to each other.

With the foregoing in mind, FIG. 1 represents a block diagram of a utility system 10, which includes a utility 12 connected to a distribution grid 14. The utility may distribute electricity, water, or gas to consumers, such as residential establishments 16 and commercial establishments 18. In electrical system 10, the utility 12 may be a power utility that supplies power to a power grid 14. In the electrical system, the residential 16 and commercial 18 establishments may be loads on the power grid 14. Utility meters 20 on the distribution grid 14 may monitor the utility consumption by the residential establishments 16 or commercial establishments 18. As mentioned above and described in greater detail below, the utility meters 20 may include various components within an enclosure. Some of these components may perform specific functions and may be disposed in certain locations relative to other components or within the enclosure.

In a normal operational state, the utility meters 20 may monitor consumption by the residential establishment 16 or the commercial establishment 18 to which they are affixed. Additionally, the utility meters 20 may communicate with the utility 12 via data communication links 22. Such data communication links 22 may be wired (e.g., over wired telecommunication infrastructure or distribution grid 14) or wireless (e.g., a cellular network or other wireless broadband, such as WiMax). Similarly, the utility 12 may employ a communication link 24 to communicate with the various utility meters 20. The communication link 24 may be wired or wireless, as may be suitable to communicate to the various communication links 22 of the utility meters 20.

The utility meters 20 may take a variety of forms. It should be noted that while the disclosed embodiments discussed below are in the context of mounting assemblies for coupling components together within an electric meter, other types of utilities are also presently contemplated. For example, meters in accordance with the disclosed embodiments may monitor any one or a combination of electricity, heat, gas, water, or any other utility. Therefore, while the disclosed embodiments are presented in the context of electric meters, other utility meters, such as heat meters, gas meters, water meters, or any combination thereof, are presently contemplated. Furthermore, energy meters, as presently discussed, may include gas meters, electricity meters, or a combination thereof.

Figure 2:
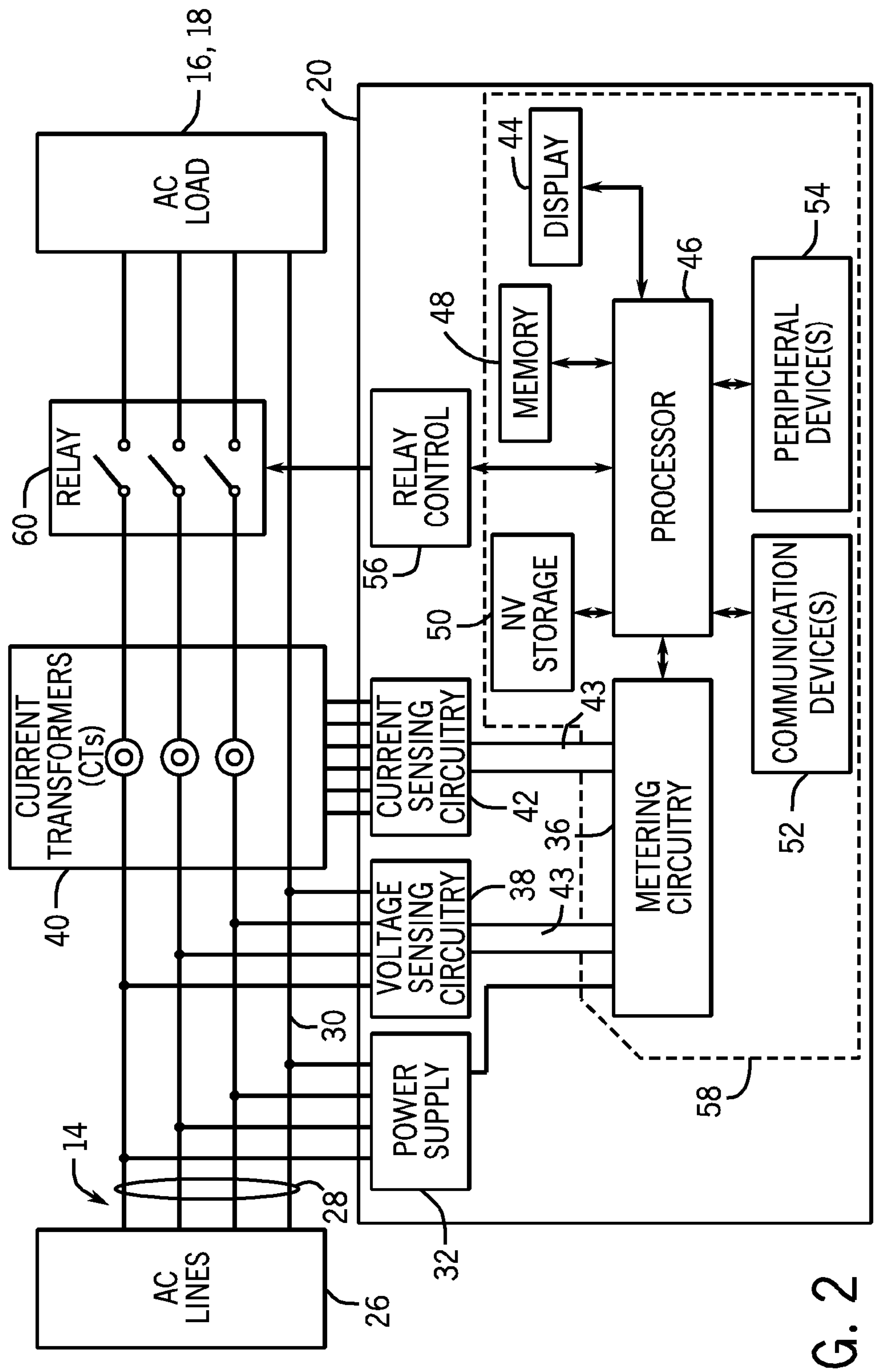
FIG. 2 is a block diagram of an embodiment of such a utility meter.

One embodiment of a three-phase electric meter 20 appears in FIG. 2 as joined to the distribution grid 14, as power flows from AC lines 26 to an AC load 16, 18 (e.g., a residential establishment 16 or a commercial establishment 18). Although the embodiment of FIG. 2 involves monitoring three-phase power, alternative embodiments of the electric meter 20 may monitor single-phase power. In the illustrated embodiment, the AC lines 26 may transmit three-phase power via three phase lines 28 and a neutral line 30. The electric meter 20 may obtain power via power supply circuitry 32 that may couple to the three phase lines 28 and the neutral line 30 for its internal power consumption. To backup power consumption data in the event of a power outage, the power supply circuitry 32 may also charge a battery and power metering circuitry 36.

Metering circuitry 36 may ascertain power consumption by monitoring the voltage and current traversing the AC lines 26 to the AC load 16, 18. In particular, voltage sensing circuitry 38 may determine the voltage based on the three phase lines 28 and the neutral line 30. Current transformers (CTs) 40 and current sensing circuitry 42 may determine the current flowing through the three phase lines 28. The voltage sensing circuitry 38 and current sensing circuitry 42 may be electrically coupled to the metering circuitry 36 by terminals 43. The terminals 43 may be electrically conductive and transmit signal between the voltage 38 or current 42 sensing circuitry and the metering circuitry 36. The metering circuitry 36 may output the current power consumption values to an electronic display 44, such as a liquid crystal display (LCD), as well as to a processor 46. The metering circuitry 36 may sense the voltage and current inputs and send corresponding signals to the processor 46, which calculates consumption parameters including the energy accumulation, power factor, active power, reactive power and maximum demand. The processor 46 may access, store, and/or execute control instructions, control parameters, and historical measurement data in memory 48 and/or nonvolatile storage 50. The processor 46 may include one or more microprocessors. Furthermore, processor 46 may, in certain embodiments, be integrated into or supported by a main meter assembly (MMA) circuit board 58. The MMA circuit board 58 may also support the metering circuitry 36, NV storage 50, memory 48, one or more communication devices 52, various peripheral devices 54, relay control 56, or any combination thereof.

The memory 48 and nonvolatile storage 50 may store the current and/or certain historical power consumption values, as well as instructions for the metering circuitry 36, communication device 52, peripheral device 54, or relay control 56, among other components. The memory 48 may include a volatile memory (RAM), a non-volatile memory (ROM), or a combination of RAM and ROM devices. The nonvolatile storage 50 may include flash memory, a hard drive, or any other optical, magnetic, and/or solid-state storage media. By way of non-limiting examples, the memory 48 and nonvolatile storage 50 may be used to store data files, such as historical power consumption as determined by the metering circuitry 36, as well as indications of consumer account balance information, dynamic power prices, and/or abnormal activity on the power grid 14 as communicated to the electric meter 20 by the power utility 12.

The electric meter 20 may communicate with the power utility 12 to obtain indications of consumer account balance information, dynamic power prices, and abnormal activity on the power grid 14. Such communication may take place via the one or more communication devices 52, which may include interfaces for a personal area network (PAN), such as a Bluetooth network, a local area network (LAN), such as an 802.11x Wi-Fi network, a wide area network (WAN), such as a 3G or 4G cellular network (e.g., WiMax), an infrared (IR) communication link, a Universal Serial Bus (USB) port, and/or a power line data transmission network such as Power Line Communication (PLC) or Power Line Carrier Communication (PLCC). Additionally, the electric meter 20 may connect to the various peripheral devices 54, such as computing devices (e.g., computers or portable phones) or input devices (e.g., a keyboard).

In certain embodiments, the power utility 12 may communicate with the electric meter 20 to remotely control the flow of power to the AC load 16, 18. Based on instructions from the power utility 12 via the communication device(s) 52, the processor 46 may correspondingly instruct the relay control 56 to open or close a relay 60. For example, if the consumer has not paid for the power being received, the relay 60 may be opened, disconnecting the AC load 16, 18 from the AC lines 26. Once the consumer has paid for further electrical power, the power utility 12 may instruct the electric meter 20 to close the relay 60, reconnecting power to the AC load 16, 18.

Figure 3:
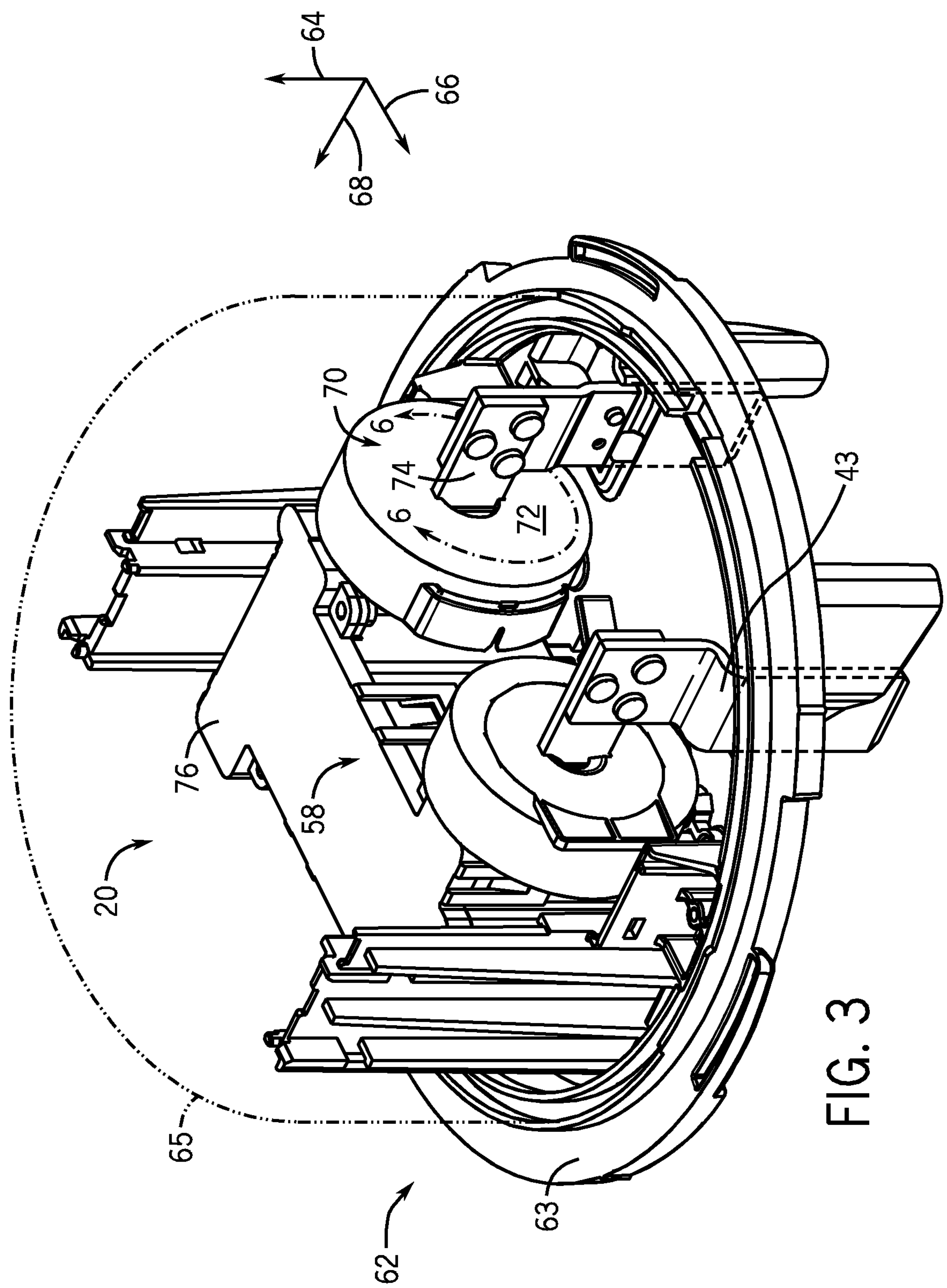
FIG. 3 is a perspective front view of an embodiment of an electricity meter having a mounting assembly.

FIG. 3 is a partial perspective view of the utility meter 20 of FIGS. 1 and 2, illustrating a meter housing 62 with a base 63 and a housing cover 65 shown in dashed lines to depict internal metering components of the meter 20. As indicated by the legend, arrow 64 indicates a vertical Y-axis relative to the base 63, arrow 66 indicates a horizontal X-axis along the base 63, and arrow 68 indicates a horizontal Z-axis along the base 63. The housing cover 65 may be configured to couple with the base 63 to enclose metering components. FIG. 3 illustrates an embodiment with a circular base 63, however alternative embodiments may have bases with various geometries configured to support metering components. A mounting assembly 70 configured to couple a first component 72 and a second component 74 may be enclosed within the meter housing 62.

Additionally, an MMA housing 76 may be enclosed within the meter housing 62. The MMA housing 76 may enclose the MMA 58 described above. The housing 62 and MMA housing 76 may be configured for use in utility meters 20, such as energy meters (e.g., gas meters or electric meters) or water meters. In some embodiments, components within the housing 62 and MMA housing 76 may be added or replaced, while the housing 62 and MMA housing 76 may remain the same. For example, the housing 62 and MMA housing 76 may be removably mounted in place on-site, and metering components may be added or replaced on-site. The mounting assembly 70 may be configured to couple added components together with existing components, the housing 62, or other added components. Furthermore, the mounting assembly 70 may be configured to mount with a variety of geometries (e.g., shapes and sizes). For example, replaced components may have different geometries than prior components, and the mounting assembly 70 may be configured to mount replaced components together with other replaced components, existing components, the housing 62, and combinations thereof. The mounting assembly 70 may also be configured to fit added or replaced components at desired locations and orientations within the housing 62 without interfering with (e.g., removing) existing components. The mounting assembly 70 may also align the first 72 and second 74 components in a desired relative orientation.

The first 72 and second 74 components may include sensors, terminals 43, the components illustrated in FIG. 2 (e.g., the power supply 32, display 46 components, relay 56 components, communication devices 52, peripheral devices 54), the MMA housing 76, and other components mounted within the meter housing 62. The first 72 and second 74 components may also include the meter housing 62 and cover 65. In some embodiments, the first component 72 may be a sensor (e.g., voltage sensing circuitry, current sensing circuitry, Rogowski coil, ammeter, ohmmeter) and the second component 74 may be a terminal 43 or portion of a terminal. In an embodiment as shown in FIG. 3, terminals 43 may extend through the base 63 and MMA housing 76 to couple the distribution grid 14 and/or metering circuitry 38, 42 (FIG. 2) with the MMA 58. As shown in FIG. 3, mounting assembly 70 may be configured to couple the first component 72 and the second component 74. The mounting assembly 70 may be configured to absorb vibration along one or more axes 64, 66, 68 and/or reduce shock on components within the enclosure of the housing 62 and cover 65. For example, the mounting assembly 70 may reduce vibration of the MMA 58 and improve the connection between the terminal 43 and MMA 58. In some embodiments, the mounting assembly 70 may be configured to absorb vibration along the X-axis 66 crosswise (e.g., perpendicular) to the Z-axis 68. As illustrated, the second component 74 extends through the first component 72. In other embodiments, the second component 74 may be coupled together with the first component 72 on an outer surface 78 of the second component 74.

Figure 4:
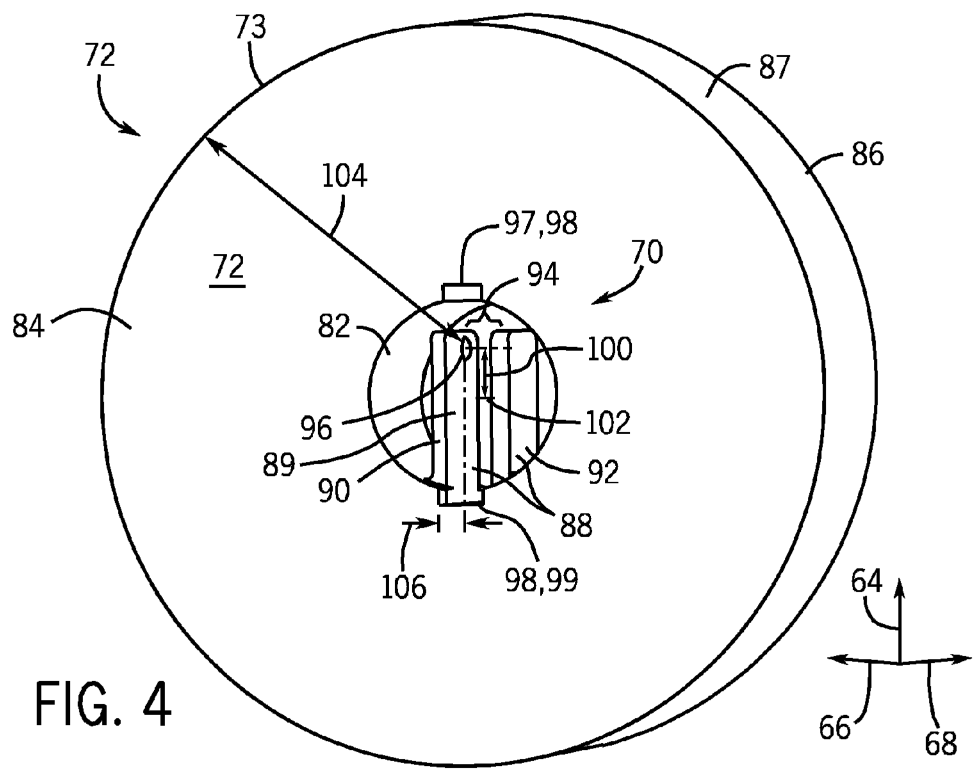
FIG. 4 is a perspective front view of an embodiment of a first component of the mounting assembly of FIG. 3.

FIG. 4 is a perspective front view of an embodiment of the first component 72 of FIG. 3, illustrating a first mount 80 of the mounting assembly 70. In some embodiments, as shown in FIG. 4, the first component 72 may have an annular shape 73 with a central region 82 having the first mount 80. In other embodiments, the first mount 80 may be on a first face 84, a second face 86, or a perimeter region 87 of the first component 72. The first mount 80 may include one or more prongs 88. In the illustrated embodiment, the first mount 80 includes a plurality of opposed prongs 88, e.g., a first prong 90 and a second prong 92, disposed about an intermediate space 94. Opposing surfaces 89 of the prongs 90, 92 may have a first snap portion 96, such that a pair of first snap portions 96 are oriented toward one another in the space 94. Each first snap portion 96 may be a male snap portion, a female snap portion, or a combination thereof. In some embodiments, the first snap portion 96 may be a detent, dimple, protrusion, peg, or post. The first snap portion 96 may have a variety of shapes, including but not limited to curved shapes (e.g., cylindrical, spherical, elliptical) or angular shapes (e.g., pyramid-shaped, rectangular-shaped, pentagonal-shaped, hexagonal-shaped). As illustrated, the prongs 88 (e.g., cantilevered prongs) are cantilevered relative to the first component 72, such that the prongs 90, 92 can resiliently flex toward or away from one another to engage and disengage the first snap portions 96 with second snap portions 110 as discussed further below.

The first component 72 may be configured to mount with the second component 74 via the mounting assembly 70. In an embodiment, the first 90 and second 92 prongs in a parallel relationship relative to one another may extend vertically along the Y-axis 64. In some embodiments, the prongs 90, 92 may fully extend across the central region 82. However, as illustrated, the prongs 90, 92 are cantilevered from the same or opposite side of the central region 82, although the prongs 90, 92 may be cantilevered from opposite sides of the central region 82. As illustrated, the prongs 88 may be rectangular in shape and extend across at least most of the region 82 (e.g., 50 to 100 percent). In other embodiments, the prongs 88 may be semicircular in shape and extend across a 1 to 50 percent of the central region 82. to 100 percent of the central region 82. These shapes and extents of the prongs 88 are not to be limiting, but are intended to provide illustrative examples. Other shapes and relative lengths of prongs 88 are envisioned. The prongs 90, 92 may be configured to absorb vibration along the horizontal axes 66 and 68. The shape and/or length of the cantilevered prongs 88 may affect the vibration and shock absorption of the mounting assembly 70. For example, long slender prongs 88 may absorb more vibration than short prongs. Material properties (e.g., resilience) may also affect the shape and/or length of the prongs 88.

Furthermore, in some embodiments, the prongs 90, 92 may extend from the first 84 or second face 86 along the Z-axis 68 or from the perimeter region 87 along a plane formed by the Y-axis 64 and X-axis 66. In an embodiment, the first component 72 may have at least one groove 98 (e.g., opposing grooves 97, 99) configured to facilitate coupling the second component 74 with the first component 72. In an embodiment, the groove 98 (e.g., opposing grooves 97, 99) may be aligned with the intermediate space 94 between the prongs 90, 92. For example, the opposing grooves 97, 99 may be generally parallel with the prongs 90, 92 and the Y-axis 64.

The disposition of the first snap portion 96 of the first component 72 may be based at least in part on the function of the first component 72, the desired orientation of the first component 72 (e.g., the prongs 90, 92 along the Y-axis 64), direction of mounting, (e.g., along the Z-axis 68) or location and orientation of other components within the housing 62. For example, the first component 72 may be configured to be coupled to the second component 74 in a specified location relative to the second component 74, relative to the housing 62, or relative to other components. The first snap portion 96 may be configured to align and orient the first component 72 in the desired orientation relative to other components. In some embodiments, the first snap portion 96 may be disposed a first distance 100 from a point 102 (e.g., centerline) within the first component 72. In another embodiment, the first snap portion 96 may be disposed a first distance 100 from a surface feature of the first component 72 or an interface with another component. In an embodiment, the first snap portion 96 may be disposed a second distance 104 from the perimeter region 87 of the first component 72. The first snap portion 96 may be disposed at a horizontal offset 106 from the first face 84. Together, the first distance 100, second distance 104, and offset 106 may define the disposition of the first snap portion 96, so that the first component 72 may be mounted in the desired orientation and location relative to the housing 62 and other components (e.g., second component 74).

Figure 5:
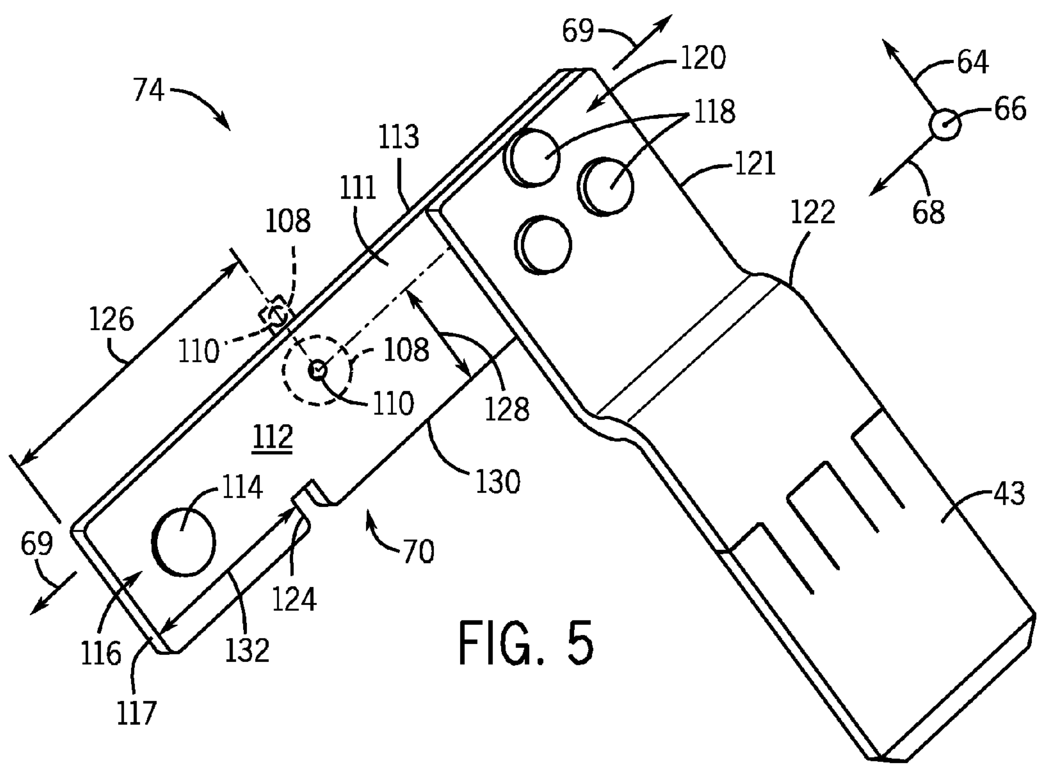
FIG. 5 is a perspective side view of an embodiment of a second component of the mounting assembly of FIG. 3.

FIG. 5 is a perspective side-view of an embodiment of the second component 74 of FIG. 3, illustrating a second mount 108 of the mounting assembly 70. The second mount 108 may have a second snap portion 110 configured to couple with the first snap portion 96 of the first component 72. The second snap portion 110 may include a male snap portion, a female snap portion, or a combination thereof, on one or both sides 111, 113 of the body 112. In some embodiments, the second mount 108 may be within the body 112 of the second component 74 as shown in FIG. 5. For example, the illustrated snap portion 110 is a female snap portion (e.g., hole) that passes through the body 112. In an embodiment, the second mount 108 may extend away from the body 112 as illustrated with the dashed lines in FIG. 5. In some embodiments, the second component 74 may be electrically conductive and coupled with the terminal 43. Furthermore, the second component 74 may be the terminal blade 43 or an electrical extension of the terminal blade 43. For example, the second component 74 may transmit signals between the terminal 43 and MMA 58 within the MMA housing 76. The second component 74 may have a contact 114 at a first end 116 portion and be electrically coupled to the terminal 43 at a joint 118 at an opposite second end portion 120. The contact 114 may transmit an electrical signal from the voltage 38 or current 42 sensing circuitry to the metering circuitry 36 on the MMA 58. A reliable connection between the contact 114 and metering circuitry 36 may provide a consistent signal and improved metering.

In an embodiment, the terminal 43 may extend through the housing base 63 along the Y-axis 64 as described above with reference to FIG. 3. The second component 74 may be coupled to the terminal 43 at the joint 118 and extend along the Z-axis 68. Both the terminal 43 and second component 74 may have various geometries configured to accommodate the housing 62 and other components within the housing 62. For example, the body of the terminal 43 and/or second component 74 may have a curved portion 122. In some embodiments, the body 112 of the second component 74 may have a notch 124. The notch 124 may be configured to locate the second component 74 relative to other components within the meter housing 62.

The disposition of the second snap portion 110 on the second component 74 may be based at least in part on the function of the second component 74, the desired orientation of the second component 74 (e.g., along the Z-axis 68), direction of mounting, or location and orientation of other components within the housing 62. For example, the second component 74 may be configured to be mounted bi-directionally as shown by arrows 69 through the central region 82 of the first component 72 and oriented in a particular manner relative to the first component 72. The second snap portion 110 may be disposed a distance 126 along the Z-axis 68 from a first end 117 and a distance 128 along the Y-axis 64 from a first edge 130. In an embodiment, the second snap portion 110 may be a hole or recess configured to engage with the first snap portion 96. Furthermore, the notch 124 may be set back a distance 132 from the first end 117 to facilitate mounting of the first 72 and second 74 components 72 and 74 at a desired position relative to one another and/or the MMA 58.

In an embodiment, the mounting assembly 70 may be configured to couple the second component 74 with the first component 72 in a particular manner so that one or both components may be disposed in a certain location within the housing 62 and cover 65 (i.e., enclosure) relative to other components. The second snap portion 108 and the notch 124 may be configured to locate the first 72 and second 74 components in particular locations within the enclosure. For example, the notch 124 may be configured to locate the second component 74 in a first position within the enclosure, and the first 96 and second 108 snap portions may be configured to locate the first component 72 in a second position relative to the second component 74. In this way, the mounting assembly 70 may be configured to locate the first 72 and second 74 components in a desired position and orientation within the enclosure relative to other components. In an embodiment, the mounting assembly 70 may be configured to couple the first 72 and second 74 components to perform a particular function. For example, in an embodiment where the first component 72 is a sensor and second component is a terminal 43 (or terminal extension), the sensor may better sense desired parameters (e.g., current, voltage, electromagnetic field) from the terminal 43 or have better contact with the terminal 43 when both components are coupled in a certain relative configuration. The certain relative configuration may be a particular position and/or orientation of the terminal 43 relative to a particular portion of the sensor. The mounting assembly 70 may be configured to mount and align the sensor and terminal 43 in the certain relative configuration. In some embodiments, the mounting assembly 70 may permit bi-directional mounting to achieve the certain relative configuration. For bi-directional mounting, the second component 74 may be mounted with the first component 72 from opposite directions as shown by arrows 69. For example, a terminal blade 43 may be mounted through the central region 82 from opposite directions along the Z-axis 68 through the first component 72. Bi-directional mounting may provide greater flexibility when adding or replacing components within the enclosure.

Figure 6:
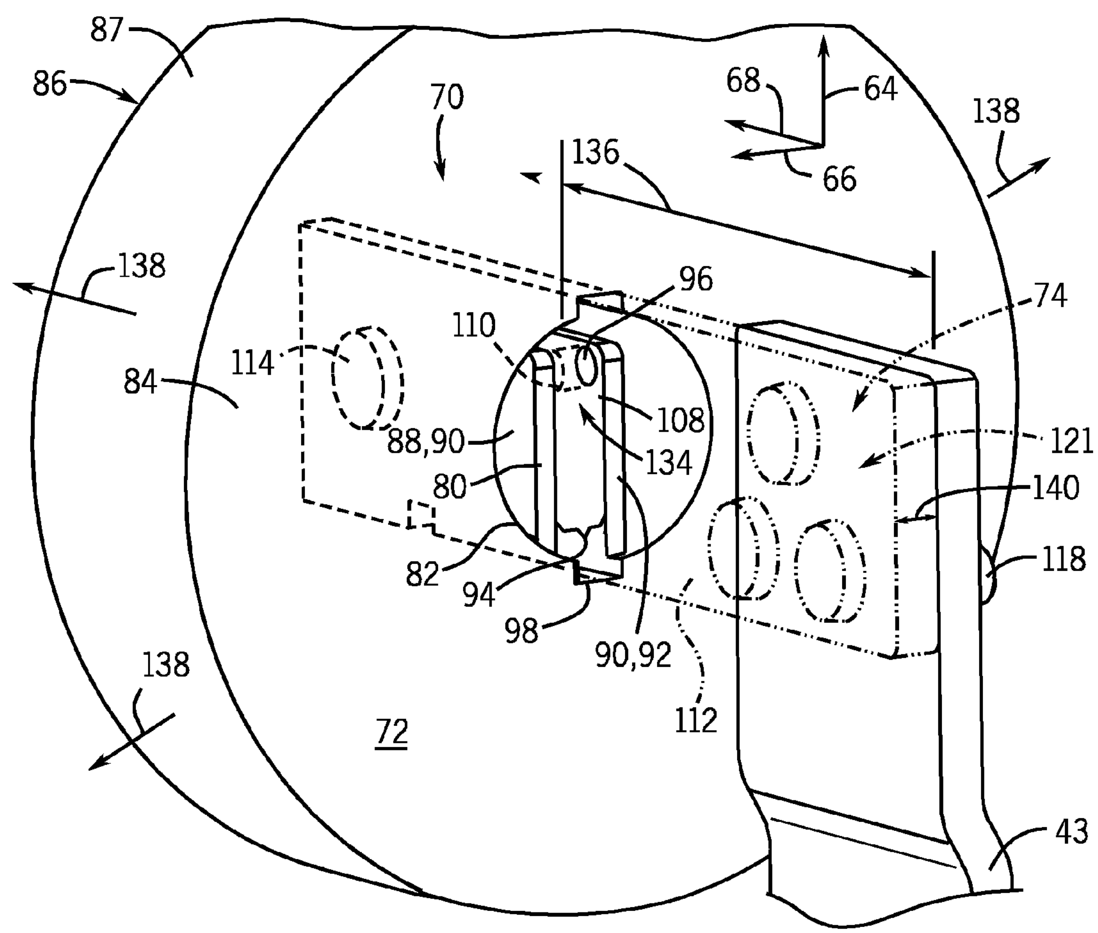
FIG. 6 is a perspective front view of an embodiment of the mounting assembly of FIG. 3 along lines 6-6.

FIG. 6 is a perspective view of an embodiment of the first 72 and second 74 components of FIGS. 4 and 5 coupled together by the mounting assembly 70. The first component 72 is shown in solid lines, while the second component 74 is shown in dashed lines for clarity. The first component 72 having the annular shape 73 and the central region 82 may be configured to bi-directionally receive the second component 74 along the Z-axis 68 from the first face 84 or the second face 86. The first component 72 may also be configured to receive the second component 74 through the intermediate space 94 and groove 98. The second component 74 may have a shape configured to be mounted from the first end portion 116 or the second end portion 120. For example, the second component 74 may have an elongated plate shape as illustrated in FIG. 5. In an embodiment, the intermediate space 94 and/or groove 98 may be narrower than a width 140 of the second component 74, and the prongs 90 may resiliently flex to accommodate the second component 74.

As further illustrated in FIG. 6, the first snap portion 96 of the first mount 80 is engaged with the second snap portion 110 of the second mount 108. As described above, the first snap portion 96 (e.g., male snap portion) may include detents, dimples, pegs, posts, or other protrusions, and the second snap portion 110 (e.g., female snap portion) may include holes or recesses. In some embodiments, the first mount 80 may include the second snap portion 110 (e.g., female snap portion of the snap-fit fastener 134) and the second mount 108 may include the first snap portion 96 (e.g., male snap portion of the snap-fit fastener 134). The first snap portion 96 may engage the second snap portion 110 as the protrusions extend into the recesses along the X-axis 66. The engaged first 96 and second 110 snap portions form the snap-fit fastener 134. In some embodiments, the snap-fit fastener 134 may bi-directionally engage the first 90 and second 108 mounts substantially along the Z-axis 68. In some embodiments, the snap-fit fastener 134 may couple the first 72 and second 74 components together when the second component 74 is mounted bi-directionally along the Y-axis 64 and/or bi-directionally along the Z-axis 68. For example, first snap portions 96 that are rotationally symmetric about the X-axis 66 (e.g., hemispherical detents, circular pegs) may readily engage second snap portions 110 (e.g., annular holes or recesses) when mounted bi-directionally along the Y-axis 64 or bi-directionally along the Z-axis 68. In other words, in the illustrated embodiment, the first snap portion 96 includes a first snap portion (e.g., a protrusion) while the second snap portion 110 includes a female snap portion (e.g., hole or recess) to collectively define a snap-fit fastener 134. However, other embodiments may have a reversed configuration of the snap-fit fastener 134, wherein the first snap portion 96 is female and the second snap portion 110 is male. In either configuration the snap-fit fastener 134 removably secures and aligns the second component 74 within the central region 82 of the first component 72 (e.g., between prongs 90, 92).

Some arrangements of the snap-fit fastener 134 may include the snap portion 96 on the first prong 90 and/or the second prong 92. In arrangements having only one snap portion 96 on the first prong 90, the second prong 92 may be a support wall without a snap portion 96 (e.g., detent, dimple, peg) configured to receive the second component 74. The first prong 90 and/or second prong 92 may be spring loaded to retain the second component 74 mounted in the intermediate space 94. Spring loaded prongs 88 may improve the vibration and shock absorption of the mounting assembly 70 and snap-fit fastener 134.

The snap-fit fastener 134 may be configured to align and position the components 72, 74 in a certain relative configuration. In the embodiment illustrated in FIG. 6, the second component 74 may be mounted bi-directionally along the Z-axis 68 by inserting the first end portion 116 through the first face 84 or by inserting the second end portion 120 through the second face 86. In an embodiment, the mounting assembly 70 may be configured to position the first component 72 at a certain location (e.g., second mount 108) along the second component 74. This may retain the second component 74 within the central region 82 of the first component 72 or position the snap-fit fastener 134 at a distance 136 from a second end 121. In an embodiment with the first mount 80 having cantilevered prongs 90 extending radially 138 from the perimeter region 87 of an annular first component 72, the second component 74 may be bi-directionally mounted along the Z-axis 68 or bi-directionally mounted in a radial direction 138.

FIG. 7 illustrates a front view of an embodiment of first and second components 72, 74 of FIGS. 4 and 5 coupled together with the mounting assembly 70. As described above, the first mount 80 of the first component 72 may include the first and second prongs 90, 92 disposed about the intermediate space 94. The second component 74 may be mounted with the first component 72 by inserting the second component 74 through the central region 82 along the Z-axis 68. The second component 74 may be mounted bi-directionally along the Z-axis 68. As described above, the first snap portion 96 may engage the second snap portion 110. The first snap portion 96 (e.g., male snap feature) may engage the second snap portion 110 (e.g., female snap feature) by extending through at least part of the second snap portion 110 as illustrated in FIG. 7. The second snap portion 110 may be a hole that extends through the second component 74. The snap-fit fastener 134 may align and orient the first and second component 72, 74 in a desired configuration. The snap-fit fastener 134 may reduce vibration and shock in at least crosswise directions (e.g., along the Y-axis 64 or X-axis 66) to the bi-directional mounting direction (e.g., Z-axis 68).

A method for supporting first 72 and second 74 components in the utility meter 20 with first 80 and second 108 mounts includes receiving the second mount 108 bi-directionally into the intermediate space 94 between first 90 and second 92 prongs 88 of the first mount 80. The mounts 80, 108 may be secured together by engaging first 96 and second 110 snap portions bi-directionally. In an embodiment, the first component 72 may be a sensor that includes the first mount 80 with the first 90 and second 92 prongs having the first snap portion 96, and the second component 74 may be a terminal blade 43 that includes the second mount 108 with the second snap portion 110. For example, the terminal blade 74 may be aligned with the central region 82 of the sensor 72 by the engagement of the first 96 and second 110 snap portions. The first 90 and second 92 prongs may bi-directionally (e.g., along the X-axis 66) absorb vibrations that are crosswise to the mounting direction (e.g., along the Z-axis 68 and/or the Y-axis 64).

Technical effects of the mounting assembly 70 described above may include coupling the first 72 and second 74 components together in a certain relative configuration to each other and other components within the enclosure. Added or replaced components may perform specific functions and fit around or accommodate existing components. Some components may be mounted at multiple locations within an enclosure; however, existing components may complicate mounting each component in a similar manner, such as in a certain direction. The mounting assembly 70 may be configured to permit bi-directional mounting of components to accommodate existing components. This may provide maintenance flexibility and reduce costs by permitting replacement of some components without replacement of others. Additionally, the mounting assembly 70 may reduce vibration and shock of other components within the enclosure.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

The invention claimed is:

1. A system, comprising:

a utility meter, comprising:

an enclosure;

a first component disposed within the enclosure;

a first mount coupled to the first component, the first mount comprising a first and a second prong extending substantially parallel to each other, separated by a distance, and defining an intermediate space therebetween, wherein at least one of the first prong or the second prong comprises a first snap portion;

a second mount configured to extend into the intermediate space between the first and second prongs, wherein the second mount comprises a second snap portion configured to engage with the first snap portion, wherein one of the first or second snap portions comprises a detent and the other one of the first or second snap portions comprises a recess or a hole; and a second component coupled to the second mount.

2. The system of claim 1, wherein the first and second prongs comprise first and second cantilevered prongs that extend along one another about the intermediate space.

3. The system of claim 2, wherein the first and second cantilevered prongs are configured to absorb vibration.

4. The system of claim 1, wherein the second mount comprises a terminal blade configured to conduct electricity.

5. The system of claim 1, wherein the first component is a sensor.

6. The system of claim 5, wherein the utility meter is an electric meter, and the second component is a terminal blade configured to conduct electricity.

7. The system of claim 1, wherein the first snap portion comprises a detent and the second snap portion comprises a recess or hole.

8. The system of claim 1, wherein the first component comprises a sensor having an annular structure defining a central region, the first and second prongs are disposed in the central region, and the second component having the second mount is configured to extend into the intermediate space between the first and second prongs in the central region.

9. A system, comprising:

a utility meter comprising a mounting assembly configured to couple first and second components, the mounting assembly comprising a first mount having first and second cantilevered prongs extending substantially parallel to one another and defining a space between the first cantilevered prong and the second cantilevered prong, at least one of the first and second cantilevered prongs comprises a first snap portion of a snap-fit fastener, the first and second cantilevered prongs are configured to receive a second mount into the intermediate space between the first cantilevered prong and the second cantilevered prong, and the first snap portion is configured to engage a second snap portion of the second mount to secure the first and second mounts, wherein one of the first or second snap portions comprises a detent and the other one of the first or second snap portions comprises a recess or a hole.

10. The system of claim 9, wherein the first and second cantilevered prongs are configured to absorb vibration.

11. The system of claim 9, wherein the mounting assembly is configured to align the second component within a central region of the first component.

12. The system of claim 9, wherein the first component is coupled to the first mount, wherein the first component is a sensor.

13. The system of claim 12, comprising a second component coupled to the second mount, wherein the second mount is a terminal blade configured to conduct electricity.

14. The system of claim 9, comprising a utility meter comprising the mounting assembly.

15. The system of claim 9, wherein the first component is a sensor.

16. The system of claim 15, wherein the sensor has an annular structure, defining a central region.

17. A method, comprising:

receiving a second mount into an intermediate space between first and second prongs of a first mount the first and second prongs extending substantially parallel to one another, wherein the first and second mounts support first and second component;

engaging first and second snap portions to secure the first and second mounts, wherein at least one of the first or second prongs of the first mount comprises the first snap portion, and the second mount comprises the second snap portion, mounting the first component and the second component in a utility meter; and aligning the second component within a central region of the first component, wherein the first component comprises a sensor and the second component comprises a terminal blade configured to conduct electricity.

18. The method of claim 17, comprising absorbing vibration with the first and second prongs.

* * * * *